(12) United States Patent
Park et al.

(10) Patent No.: US 7,201,327 B1
(45) Date of Patent: Apr. 10, 2007

(54) MEMORY CARD AND ITS MANUFACTURING METHOD

(75) Inventors: Chul Woo Park, Kangdong-gu (KR);
Sang Jae Jang, Gwangjin-gu (KR);
Sung Su Park, Gwangjin-gu (KR);
Choon Heung Lee, Gwangju (KR);
Suk Gu Ko, Kangdong-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 227 days.

(21) Appl. No.: 10/967,462

(22) Filed: Oct. 18, 2004

(51) Int. Cl.
*G06K 19/06* (2006.01)
(52) U.S. Cl. .................................... 235/492; 235/490
(58) Field of Classification Search ................ 235/492, 235/497, 487, 441, 49
See application file for complete search history.

(56) References Cited

U.S. PATENT DOCUMENTS

| | | |
|---|---|---|
| 3,668,299 A | 6/1972 | McNeal |
| 4,222,516 A * | 9/1980 | Badet et al. ............... 235/492 |
| 4,501,960 A * | 2/1985 | Jouvet et al. .............. 235/492 |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 5,360,992 A | 11/1994 | Lowrey et al. |
| 5,574,309 A | 11/1996 | Papapietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota et al. |
| 5,808,359 A | 9/1998 | Muto et al. |
| 5,822,190 A | 10/1998 | Iwasaki |

(Continued)

FOREIGN PATENT DOCUMENTS

JP  3112688  5/1991

(Continued)

*Primary Examiner*—Daniel Stcyr
(74) *Attorney, Agent, or Firm*—Stetina Brunda Garred & Brucker

(57) ABSTRACT

A memory card comprising a die paddle having opposed, generally planar first and second die paddle surfaces and multiple peripheral edge segments. Disposed along and in spaced relation to one of the peripheral edge segments of the die paddle is a plurality of contacts, each of which has opposed, generally planar first and second contact surfaces. An inner body partially encapsulates the die paddle and the contacts, the first contact surface of each of the contacts and the first die paddle surface of the die paddle being exposed in and substantially flush with a generally planar first inner body surface of the inner body. The inner body further defines a generally planar second inner body surface which is disposed in opposed relation to the first inner body surface, the second contact surface of each of the contacts being exposed in the second inner body surface. At least one electronic circuit element is attached to the first die paddle surface and electrically connected to at least one of the contacts. An outer body partially encapsulates the inner body such that the first die paddle surface, the first contact surface of each of the contacts, the first inner body surface and the electronic circuit element are covered by the outer body, with the second inner body surface and hence the second contact surface of each of the contacts not being covered by the outer body and thus exposed.

29 Claims, 9 Drawing Sheets

U.S. PATENT DOCUMENTS

| | | | |
|---|---|---|---|
| 5,893,724 A | 4/1999 | Chakravorty et al. | |
| 5,977,613 A | 11/1999 | Takata et al. | |
| 6,040,622 A | 3/2000 | Wallace | |
| 6,143,981 A | 11/2000 | Glenn | |
| D445,096 S | 7/2001 | Wallace | |
| D446,525 S | 8/2001 | Okamoto et al. | |
| 6,376,283 B1 | 4/2002 | Chen | |
| 6,384,472 B1 | 5/2002 | Huang | |
| 6,462,273 B1 | 10/2002 | Corisis et al. | |
| 6,476,469 B2 | 11/2002 | Hung et al. | |
| 6,545,332 B2 | 4/2003 | Huang | |
| 6,594,154 B1 * | 7/2003 | Brewer et al. | 361/801 |
| 6,603,196 B2 | 8/2003 | Lee et al. | |
| 6,624,005 B1 | 9/2003 | Di Caprio et al. | |

FOREIGN PATENT DOCUMENTS

| | | |
|---|---|---|
| JP | 7017175 | 1/1995 |
| JP | 8190615 | 7/1996 |
| JP | 10334205 | 12/1998 |

* cited by examiner

MEMORY CARD AND ITS MANUFACTURING METHOD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

Field of the Invention

The present invention relates generally to memory cards, and more particularly to a memory card (e.g., a multi-media card (MMC)) wherein a two-step mold procedure is used to form an outer memory card body which encapsulates an inner memory card body and leadframe structure so that remaining portions of the tie bars used to connect the external signal contacts of the leadframe to the outer frame thereof can be effectively covered by the outer memory card body. The outer body of the memory card of the present invention may also be configured such that the host socket connector pins of a host socket are not damaged by the repeated advancement of the memory card into the host socket.

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically exposed on the backside of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with the die pad of the leadframe and the semiconductor die mounted thereto being disposed within or covered by the body.

Memory cards, such as multi-media cards, are used by advancing the same into a host socket which includes a plurality of connector pins. Many host sockets include nine connector pins to accommodate the seven contacts included in many memory card formats such as multi-media cards, and the nine contacts included in the secure digital card memory card format. One of the drawbacks associated with leadframe based memory cards is that portions of the tie bars which are used to connect the contacts to the outer frame of the leadframe are typically exposed in the leading edge of the memory card which is initially advanced into the host socket. More particularly, exposed within this leading edge are the severed ends of the tie bars created as a result of the cutting or singulation process typically used to separate the outer frame of the leadframe from the remainder thereof subsequent to the formation of the body of the memory card. These exposed portions of the tie bars give rise to a potential short against the metal features of the host socket, and are thus highly undesirable. As a result, despite the reduced costs associated with leadframe based memory cards, certain manufacturers are reluctant to use the same due to the potential of generating electrical shorts as described above, and further in view of the appearance of the memory card attributable to the exposure of the severed ends of the tie bars in the leading edge thereof.

Another drawback associated with currently known leadframe based memory cards is their susceptibility to extreme warpage. In this regard, the memory card has a relatively large area, with the thermal expansion coefficients of the memory card body, the leadframe, and the semiconductor die or other internal circuit elements differing from each other. As the capacity of the memory increases, the memory card frequently emits a large amount of heat or receives heat from the device in which it is used. This heat may cause warpage of the memory card, which deteriorates the reliability thereof and may result in the cracking of the internal leadframe or electronic circuit elements.

Yet another deficiency of currently known leadframe based memory cards is that the leading edge of the body thereof is typically fabricated to define a corner which is angled at approximately ninety degrees. This sharp corner, provided on a body typically fabricated from a material significantly harder than general plastic products, often results in some measure of damage to the device into which the memory card is inserted. Such damage is typically evident over time after repeated cycles of the insertion of the memory card into the host socket of the device, the damage often occurring as a result of the contact or rubbing of the sharp leading edge of the memory card against the device.

The present invention addresses and overcomes the above-described deficiencies of currently known leadframe based memory cards by providing a memory card wherein a two-step mold procedure is used to form an outer memory card body which partially encapsulates an inner memory card body itself partially encapsulating the memory card leadframe structure. As a result, the remaining portions of the tie bars used to secure the contacts to the outer frame of the leadframe are completely covered by the outer memory card body. The outer memory card body may further be formed to define a rounded or chamfered leading edge adapted to prevent damage to any device including a host socket into which the memory card is advanced. Also alleviated by the configuration of the memory card of the present invention are many of the warpage problems discussed above. These and other attributes of the present invention will be described in more detail below.

BRIEF SUMMARY OF THE INVENTION

In accordance with the present invention, there is provided multiple embodiments of a memory card. A common feature of each embodiment of the memory card of the present invention is the inclusion of separately molded inner and outer bodies. The inner body is used to at least partially encapsulate the contacts of the memory card and, in certain embodiments, a die paddle to which an electronic circuit element is mounted. An outer body is used to at least partially encapsulate the inner body in a manner covering tie bar residuals integrally connected to and extending from the contacts such that the leading edge of the fully formed memory card is devoid of any exposed metal features. In those embodiments wherein no die paddle is include in the memory card, the electronic circuit element is mounted either directly to the inner body or to an interposer attached to the inner body. The inner body may optionally be formed with surface features which enhance the adhesion to the outer body.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
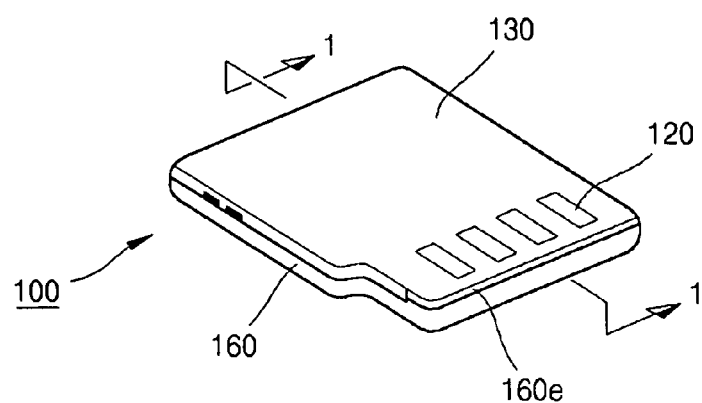
FIG. 1A is a bottom perspective view of a memory card constructed in accordance with a first embodiment of the present invention.
Figure 1B:
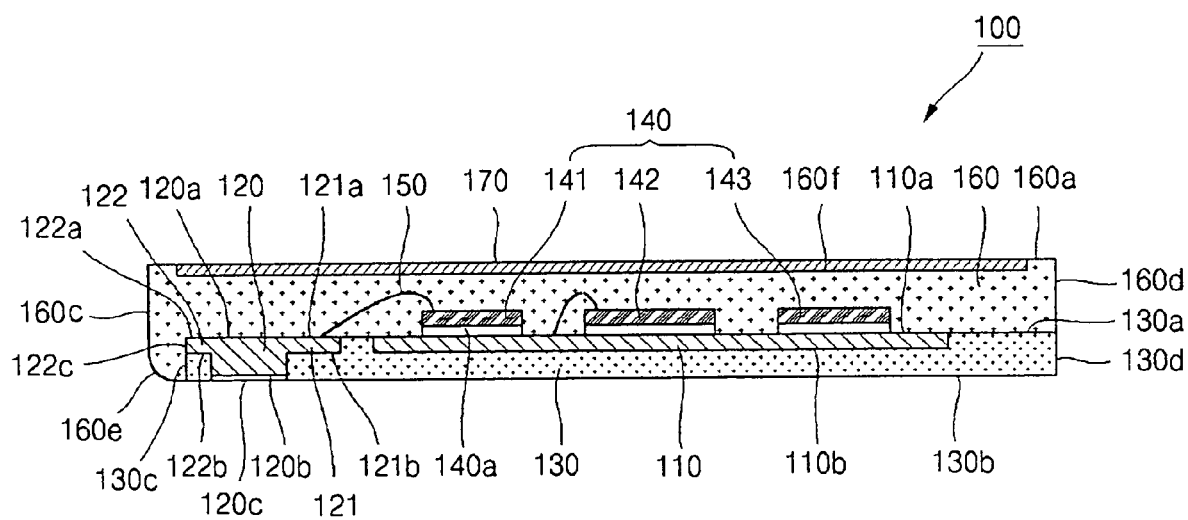
FIG. 1B is a cross-sectional view of the memory card shown in FIG. 1A.
Figure 1C:
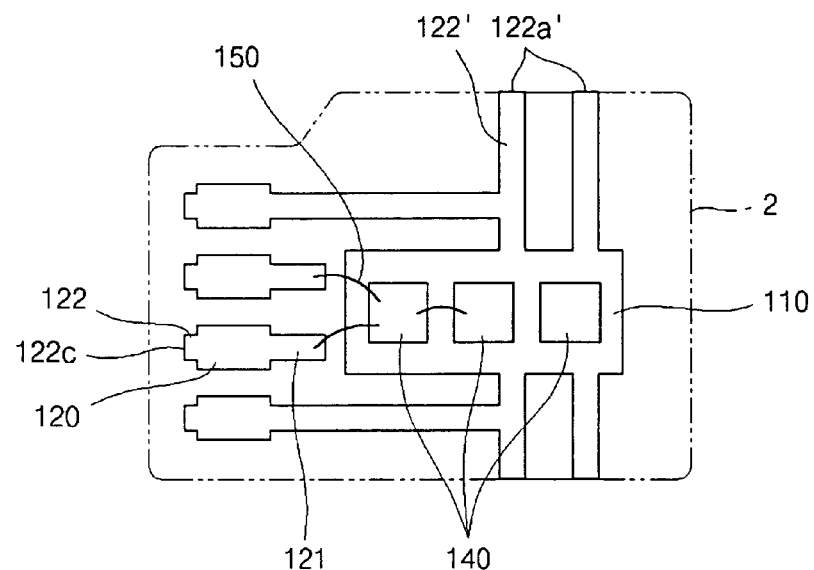
FIG. 1C is a top plan view of the leadframe of the memory card of the first embodiment in its final, singulated state, the profile of the outer body of the memory card being shown in phantom.

Referring now to the drawings wherein the showings are for purposes of illustrating preferred embodiments of the present invention only, and not for purposes of limiting the same, FIGS. 1A–1C depict a memory card 100 constructed in accordance with a first embodiment of the present invention. The memory card 100 includes a leadframe LF which is shown in its final, singulated state in FIG. 1C and in its original, unsingulated state in FIG. 12A. The leadframe LF of the memory card 100 includes a die paddle 110 which defines a generally planar first (upper) surface 110a and an opposed, generally planar second (lower) surface 110b. The die paddle 110 is preferably formed to have a quadrangular (e.g., square, rectangular) configuration, though other shapes for the die paddle 110 are contemplated to be within the spirit and scope of the present invention.

Figure 2:
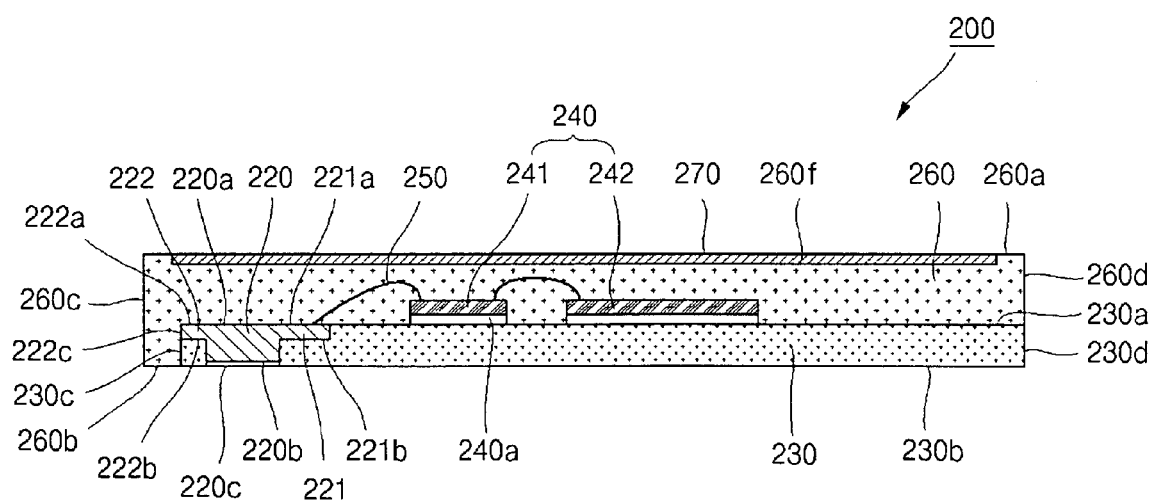
FIG. 2 is a cross-sectional view of a memory card constructed in accordance with a second embodiment of the present invention.

In addition to the die paddle 110, the leadframe LF of the memory card 100 comprises a plurality of contacts 120 which extend along and in spaced relation to one of the sides or peripheral edge segments of the die paddle 110. Each of the contacts 120 defines a generally planar first (upper) surface 120a and an opposed, generally planar second (lower) surface 120b. The die paddle 110 and contacts 120 are arranged such that the first surfaces 110a, 120a thereof extend in generally co-planar relation to each other. Integrally connected to and extending from at least some of the contacts 120 toward the die paddle 10 is an elongate trace 121. Each trace 121 itself defines a generally planar first (upper) surface 121a and an opposed, generally planar second (lower) surface 121b. Also integrally connected to each contact 120 and extending therefrom in a direction opposite to that of the corresponding trace 121 is a tie bar residual 122. Each tie bar residual 122 itself defines a generally planar first (upper) surface 122a and an opposed, generally planar second (lower) surface 122b. As best seen in FIG. 2, in the leadframe, the die paddle 110, contacts 120, traces 121 and tie bar residuals 122 are arranged such that the first surfaces 110a, 120a, 121a, 122a thereof extend in generally co-planar relation to each other. However, each of the contacts 120 is formed such that the thickness thereof (i.e., the distance separating the first and second surfaces 120a, 120b from each other) exceeds the thicknesses of the die paddle 110, traces 121 and tie bar residuals 122 which are preferably equal to each other. Thus, while the second surfaces 110b, 121b, 122b of the die paddle 110, traces 121 and tie bar residuals 122 extend in generally co-planar relation to each other, the second surfaces 120b of the contacts 120 are outwardly offset relative thereto. The second surfaces 120b of the contacts 120 extend in generally co-planar relation to each other.

Figure 12A:
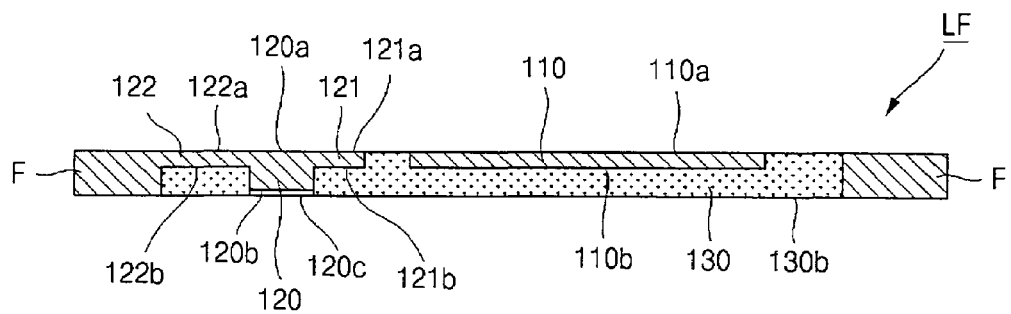
FIGS. 12A–12F illustrate an exemplary sequence of steps which may be used to facilitate the fabrication of the memory card of the first embodiment shown in FIGS. 1A–1C.

As indicated above, the leadframe LF of the memory card 100 is shown in FIG. 1C in its final, singulated state. In its original, unsingulated state as shown in FIG. 12A, tie bars (identified with the reference numeral 122 in FIG. 12A) are integrally connected to and extend from each of the contacts 120 to an outer frame F of the leadframe LF. Similarly, the die paddle 110 is integrally connected to and supported within the interior of the outer frame F of the leadframe LF by tie bars 122' which are attached to and extend between the die paddle 110 and the outer frame F. After the formation of an inner body 130 of the memory card 100 as will be described in more detail below, the leadframe LF is subjected to a number of singulation processes wherein portions of the leadframe LF, and most notably the outer frame F, are removed from the remainder thereof. The completion of the singulation processes (which will be described below) effectively severs the tie bars 122 extending to the contacts 120 and the tie bars 122' extending from the die paddle 110 from the outer frame F. As a result of the completion of the singulation processes, only the aforementioned tie bar residuals 122 remain upon each of the contacts 120, each of the tie bar residuals 122 further defining a lateral surface or outer end 122c formed as a result of the severing thereof. Similarly, each of the tie bars 122' defines a lateral surface or outer end 122a' which is formed as a result of a severing thereof from the outer frame F of the leadframe LF.

Prior to its singulation, the leadframe LF of the memory card 110 is partially encapsulated by an inner body 130 which is formed as a result of the hardening of an encapsulant material applied to the leadframe LF. As seen in FIG. 1B, the encapsulant material is applied to the leadframe LF such that the resultant inner body 130 covers the die paddle 110, contacts 120, traces 121 and tie bar residuals 122 in a manner wherein the first surfaces 110a, 120a, 121a, 122a are exposed in and substantially flush with a generally planar first (upper) surface 130a of the inner body 130. The first surfaces 110a, 120a, 121a, 122a, 130a thus extend in substantially co-planar relation to each other. In addition to defining the first surface 130a, the inner body 130 defines a generally planar second (lower) surface 130b which is disposed in opposed relation to the first surface 130a. The second surfaces 130b of the contacts 120 are not covered by the inner body 130, and are exposed in the second surface 130b thereof. The inner body 130 is further formed to define a first lateral side surface 130c and a second lateral side surface 130d which is disposed in opposed relation to the first lateral side surface 130c. The severed outer ends 122c of the tie bar residuals 122 are exposed in and substantially flush with the first lateral side surface 130c of the inner body 130. The severed outer ends 122a' of the tie bars 122' are themselves exposed in and substantially flush with respective ones of an opposed pair of first and second longitudinal side surfaces of the inner body 130 which extend between the first and second lateral side surfaces 130c, 130d thereof. As will be recognized, the exposure of the outer ends 122c of the tie bar residuals 122 in the first lateral side surface 130c and the exposure of the outer ends 122a' of the tie bars 122' in the first and second longitudinal side surfaces of the inner body 130 occurs as a result of the singulation of the leadframe LF (i.e., the removal of the outer frame thereof) subsequent to the formation of the inner body 130.

The encapsulant used to form the inner body 130 may include, for example an epoxy, a plastic molding compound, or equivalents thereto. The thickness of the inner body 130 (i.e., the distance separating the first and second surfaces 130a, 130b thereof) is preferably substantially equal to the thickness of each of the contacts 120 (i.e., the distance separating the first and second surfaces 120a, 120b thereof). In the fully formed inner body 130, the second surfaces 110b, 121b, 122b of the die pad 110, traces 121 and tie bar residuals 122 are covered by the inner body 130. It is contemplated the exposed second surface 120b of each contact 120 will have a plating layer 120c of predetermined thickness applied thereto. Each plating layer 120c is used to assist in the electrical connection of the memory card 100 to an external device, and may be fabricated from any suitable conductive material, such as Au, Ag, Sn/Pb, or their equivalents. Advantageously, the difference in the thicknesses between each contact 120 and the traces 121 and tie bar residuals 122 connected thereto, and resultant underflow of encapsulant material over the second surfaces 121b, 122b, effectively increases the bonding forces or force of adhesion between the inner body 130 and the contacts 120, traces 121 and tie bar residuals 122.

The memory card 100 of the first embodiment further comprises at least one electronic circuit element 140 which is attached to the first surface 110a of the die paddle 110 through the use of a layer 140a of suitable adhesive. Such adhesive may include, for example, an adhesive film/tape, an anisotropic conductive film/paste, epoxy, or an equivalent thereto. The electronic circuit element 140 itself may comprise a semiconductor package 141, a semiconductor die 142, and/or a passive element 143, but is not limited thereto. Further, the electronic circuit element 140 may take a form in which two or more elements are stacked. Although the electronic circuit element 40 is shown in FIG. 1B as including three components (the semiconductor package 141, semiconductor die 142 and passive element 143), those of ordinary skill in the art will recognize that this particular combination is illustrative only, in that the nature and number of the components included in the electronic circuit element 140 may be varied, and provided in a multiplicity of different combinations. In the configuration shown in FIG. 1B, a conductive wire 150 is used to electrically connect the electronic circuit element 140 to one or more of the contacts 120 via one or more of the traces 121. In this regard, the conductive wire 150 shown in FIG. 1B extends and is electrically connected to the trace 121, which is in turn integrally connected to a corresponding contact 120. Conductive wires 150 may also be used to connect the electronic circuit element 140 to the die paddle 110, and/or the various components of the electronic circuit element 140 to each other. The conductive wire(s) 150 may be fabricated from, for example Au, Al, Cu, or equivalents thereto. It is contemplated that alternatives to the conductive wires 150 may be used to facilitate the electrical connection of the electronic circuit element 140 to one or more contacts 120. More particularly, though not shown, conductive bumps, conductive adhesive, or equivalents thereto may be used to facilitate such electrical connection.

The leadframe LF of the memory card 100 is preferably fabricated from a conductive metal material (e.g., copper) through either a chemical etching or mechanical stamping process. Those of ordinary skill in the art will recognize that the leadframe LF may be formed to include any number of contacts 120 depending on the desired application for the memory card 100. Thus, the number of contacts 120 shown in FIGS. 1A and 1C is exemplary only. Additionally, rather than being attached to the first surface 110a of the die paddle 110, it is contemplated that the leadframe LF may alternatively be configured such that the die paddle 110 is completely eliminated therefrom, the size of the traces 121 being increased to a point wherein the electronic circuit element 140 may be attached directly to portions thereof. Further, the pattern of the traces 121 may also be varied depending on the number of contacts 120 and the number of components included in the electronic circuit element 140. Thus, the configuration of the leadframe LF of the memory card 100 is variable, in that the number and arrangement of components in the electronic circuit element 140, the number of contacts 120, and the number and arrangement of conductive traces 121 may be varied as needed to satisfy the requirements of a particular application.

After the inner body 130 has been applied to the leadframe LF in the above-described manner, and the electronic circuit element 140 has been attached to the die paddle 110 and electrically connected the leadframe through the use of the conductive wires 150, an outer body 160 is formed to partially cover the inner body 130, leadframe LF, and electronic circuit element 140. As best seen in FIGS. 1A and 1B, the outer body 160 defines a generally planar first (upper) surface 160a. Formed in the first surface 160a is a detent or recess 160f which is sized and configured to accommodate a label 170 which is fixed to the outer body 160 subsequent to the formation thereof. The receipt of the label 170 into the recess 160f prevents the label 170 from shifting or otherwise becoming displaced relative to the outer body 160.

In the completed memory card 100, the outer body 160 further defines a first lateral side surface 160c and a second lateral side surface 160d which is disposed in opposed relation to the first lateral side surface 160c. The first and second lateral side surfaces 160c, 160d each extend at approximately a right angle relative to the first surface 160a. The outer body 160 is preferably formed such that the second lateral side surface 160d thereof is substantially continuous with the second lateral side surface 130d of the inner body 130 as seen in FIG. 1B. Additionally, as seen in FIG. 1A, it is contemplated that the outer body 160 will include an opposed pair of first and second longitudinal side surfaces which extend between the first and second lateral side surfaces 160c, 160d thereof, and are substantially continuous with respective ones of the first and second longitudinal side surfaces of the inner body 130. The first lateral side surface 160c of the outer body 160 transitions to a rounded corner or surface 160e. The rounded surface 160e extends to and is substantially flush with the second surface 130b of the inner body 130. The rounded surface 160e defines the leading edge of the memory card 100, and is specifically configured to prevent the device into which memory card 100 is inserted from being scratched or otherwise damaged by the memory card 100 as a result of such insertion.

The outer body 160, when fully formed, completely covers the electronic circuit element 140 and the conductive wires 150. Also covered by the outer body 160 are the exposed portions of the first surfaces 110a, 120a, 121a, 122a, 130a of the die paddle 110, contacts 120, traces 121, tie bar residuals 122, and inner body 130. Importantly, the outer body 160 also covers the first lateral side surface 130c of the inner body 130 and the outer ends 122c of the tie bar residuals 122 exposed therein. Thus, the outer ends 122c of the tie bar residuals 122 are not exposed in the completed memory card 100, with no metal at all being exposed in first lateral side surface 160c or rounded surface 160e of the outer body 160. Though the outer ends 122a' of the tie bars 122' are exposed in respective ones of the first and second longitudinal side surfaces of the inner body 130 and are not covered by the outer body 160 (as shown in FIG. 1A), such exposure is not problematic since such outer ends 122a' are not located near the contacts 120 and are not advanced into the host socket, thus creating little risk of generating electrical shorts between the tie bars 122' and an external device into which the memory card 100 is inserted.

In the memory card 100, it is contemplated that the encapsulant material used to form the outer body 160 may have a thermal expansion co-efficient similar to that of the encapsulant material used to form the inner body 130. In this regard, the encapsulant material used to form the inner and outer bodies 130, 160 may be identical. Thus, it is possible to effectively prevent warpage caused by the difference among the thermal expansion coefficients of the die paddle 110, the contacts 120, and the electronic circuit element 140. The encapsulant material used to form the inner body 130 and/or the outer body 160 may include, for example, an epoxy, a plastic molding compound, or equivalents thereto, the present invention not being limited to any specific materials for the inner and outer bodies 130, 160.

Referring now to FIGS. 12A–12F, there is shown an exemplary sequence of steps which may be used to facilitate the fabrication of the memory card 100 of the first embodiment of the present invention. In the initial step of the sequence, the above-described unsingulated leadframe (identified in FIG. 12A as with the reference letters LF) is provided, and partially encapsulated with the inner body 130 (FIG. 12A). As also indicated above, in its unsingulated state, the leadframe LF includes an outer frame (identified in FIGS. 12A–12E with the reference letter F). In FIG. 12A, the tie bars 122 attached to and extending between the outer frame F and respective ones of the contacts 120 are shown, though the tie bars 122' attached to and extending between the die paddle 110 and the outer frame F are not shown.

Figure 12B:
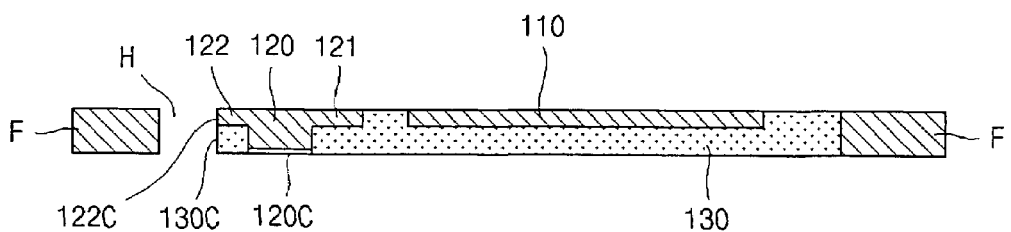

Subsequent to the formation of the inner body 130, an initial singulation process is completed to facilitate the severing of the tie bars 122 from the outer frame F. More particularly, a portion of the leadframe LF is subjected to a punching, laser, or other singulation process which effectively causes a hole H to be formed through a portion of the inner body 130, the formation of such hole H also facilitating the removal of substantial portions of the tie bars 122 from the leadframe LF (FIG. 12B). In this regard, only one small segment of each tie bar 122 remains subsequent to the formation of the hole H, such remaining segment being identified as the tie bar residual 122 in FIGS. 12B–12F (as well as FIGS. 1B and 1C). Despite the removal of substantial portions of the tie bars 122 as a result of the formation of the hole H, the contacts 120 are maintained in prescribed spatial relationships relative to each other by the partial encapsulation thereof within the inner body 130. It should be noted that the inner body 130, when initially formed, fills the interior of the outer frame F of the leadframe LF.

Figure 12C:
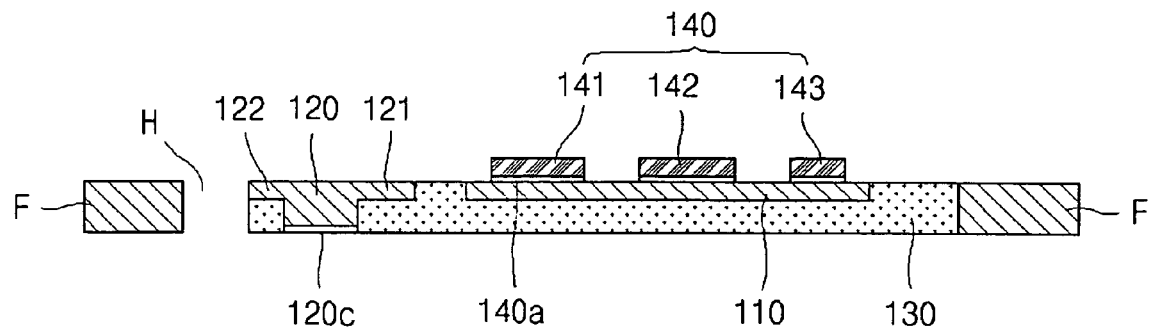
Figure 12D:
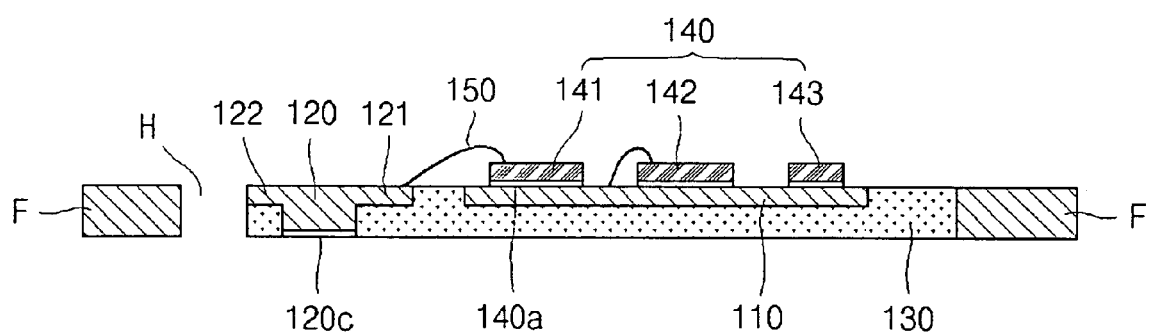

Subsequent to the formation of the hole H and partial removal of the tie bars 122 (FIG. 12B), the electronic circuit element 140 is adhered to the first surface 110a of the die paddle 110 of the leadframe LF through the use of the layers 140 of adhesive (FIG. 12C). Thereafter, a wire bonding process is completed to facilitate the electrical connection of the electronic circuit element 140 to the leadframe LF through the use of the conductive wire(s) 150 in the above-described manner (FIG. 12D).

Figure 12E:
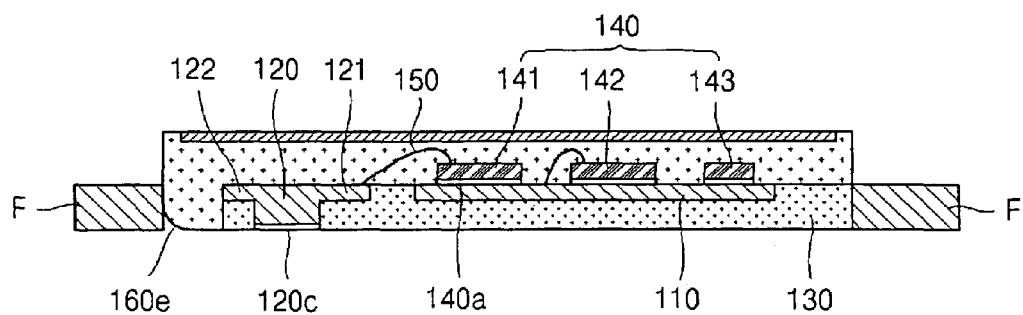
Figure 12F:
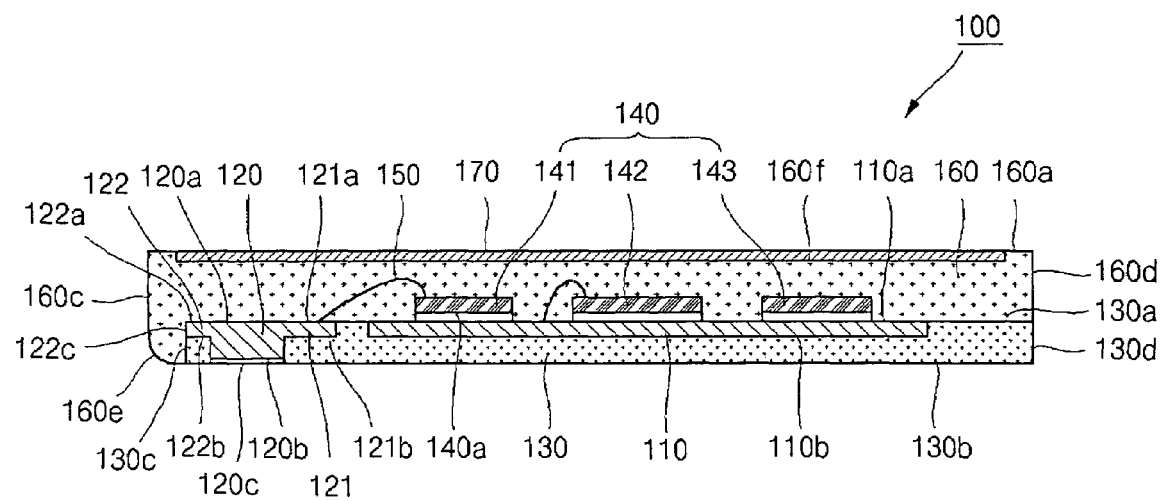

In the next step of the fabrication sequence for the memory card 100, the outer body 160 is formed to have the above-described structural attributes (FIG. 12E). As indicated above, the outer body 160 covers the first surfaces 110a, 120a, 121a, 122a, 130a of the die paddle 110, the contacts 120, the traces 121, the tie bar residuals 122 and the inner body 130. Also covered by the outer body 160 are the electronic circuit element 140 and conductive wire(s) 150. The encapsulant material which hardens to form the outer body 160 also flows into the hole H, thus resulting in the outer body 160 covering the outer ends 122c of the tie bar residuals 122 in addition to the first lateral side surface 130c of the inner body 130. Subsequent to the formation of the outer body 160, the leadframe LF is subjected to a follow-up singulation process which facilitates the severing of the tie bars 122' and removal of the outer frame F (FIG. 12F). Such severing of the tie bars 122' results in the exposure of the outer ends 122a' in respective ones of the first and second longitudinal side surfaces of the inner body 130 in the above-described manner. The removal of the outer frame F completes the fabrication of the memory card 100. Those of ordinary skill in the art will recognize that the construction of the memory card 100 is not necessarily limited to the precise order or sequence of steps described above.

Referring now to FIG. 2, there is shown a memory card 200 constructed in accordance with a second embodiment of the present invention. The memory card 200 of the second embodiment bears substantial similarity in construction to the memory card 100 of the first embodiment, with the 200 series reference numerals in FIG. 2 being used to identify the same structures identified by the corresponding 100 series reference numerals included in FIGS. 1A–1C. In this regard, only the distinctions between the memory cards 200, 100 will be discussed below.

The primary distinction between the memory cards 100, 200 lies in the absence of any die paddle in the leadframe of the memory card 200. In this regard, in contrast to the leadframe LF of the memory card 100 which includes the die paddle 110, such die paddle is not included in the leadframe of the memory card 200. As a result, the electronic circuit element 240 of the memory card 200 is attached directly to the first surface 230a of the inner body 230. In the memory card 200 as shown in FIG. 2, the electronic circuit element 240 attached directly to the inner body 230 via the layers 240a of a suitable adhesive differs from the electronic circuit element 140 due to the absence in the electronic circuit element 240 of the passive element 143 described in relation to the electronic circuit element 140. In the electronic circuit element 240, a conductive wire 250 is used to electrically connect the semiconductor package 241 and the semiconductor die 242 to each other, with a conductive wire 250 also being used to facilitate the electrical connection of the semiconductor package 241 of the electronic circuit element 240 to at least one of the contacts 220 via at least one of the traces 221.

The memory card 200 further differs from the memory card 100 in that the outer body 260 of the memory card 200 is not formed to include the rounded surface 160e described above in relation to the outer body 160. In this respect, the outer body 260 of the memory card 200 includes a generally planar second (lower) surface 260b which extends in generally co-planar relation to the second surface 230b of the inner body 230. The first lateral side surface 260c of the outer body 260 extends generally perpendicularly between the first and second surfaces 260a, 260b thereof. The fabrication methodology for the memory card 200 closely mirrors that of the memory card 100, with the primary distinction lying in the attachment of the electronic circuit element 240 to the first surface 230a of the inner body 230 as opposed to a die paddle.

Figure 3:
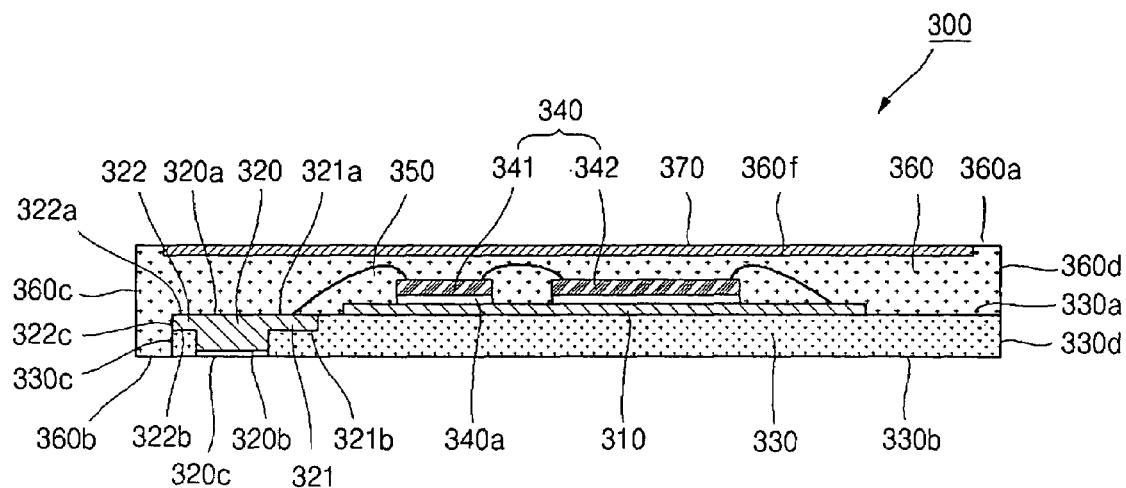
FIG. 3 is a cross-sectional view of a memory card constructed in accordance with a third embodiment of the present invention.

Referring now to FIG. 3, there is shown a memory card 300 constructed in accordance with a third embodiment of the present invention. The memory card 300 of the third embodiment bears substantial similarity in construction to the memory card 200 of the second embodiment, with the 300 series reference numerals in FIG. 3 being used to identify the same structures identified by the corresponding 200 series reference numerals included in FIG. 2 and the corresponding 100 series reference numerals included in FIGS. 1A–1C. Only the distinctions between the memory cards 300, 200 will be discussed below.

The memory card 300 of the third embodiment differs from the memory card 200 in that the electronic circuit element 340 of the memory card 300 is attached to one side or face of a generally planar interposer 310 through the use of layers 340a of a suitable adhesive. The surface of the interposer 310 opposite that having the electronic circuit element 340 attached thereto is itself attached to the generally planar first surface 330a of the inner body 330 of the memory card 300. The interposer 310, which preferably includes various circuit patterns, may be a printed circuit board, a circuit tape, a circuit film, or equivalents thereto. Though not shown in FIG. 3, it is contemplated that the interposer 310 will have a plurality of circuit patterns formed on the surfaces and/or within the interior thereof. In the memory card 300, a conductive wire 350 may be used to electrically connect the electronic circuit element 340 to the interposer 310. The manufacturing methodology for the memory card 300 closely mirrors that of the memory card 200, except that the electronic circuit element 340 is attached to the interposer 310 which is itself attached to the inner body 330, as opposed to the electronic circuit element 340 being directly attached to the inner body 330. The inclusion of the interposer 310 in the memory card 300 allows the electronic circuit element 340 integrated into the memory card 300 to be of increased capacity.

Figure 4:
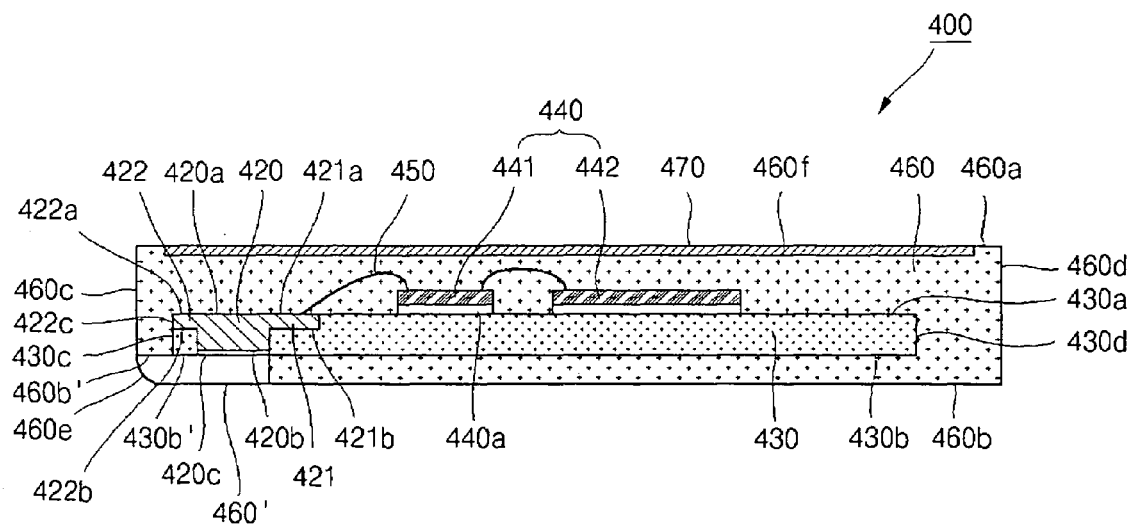
FIG. 4 is a cross-sectional view of a memory card constructed in accordance with a fourth embodiment of the present invention.

Referring now to FIG. 4, there is shown a memory card 400 constructed in accordance with a fourth embodiment of the present invention. The memory card 400 of the fourth embodiment bears substantial similarity to the memory card 200 of the second embodiment, with the 400 series reference numerals in FIG. 4 being used to identify the same structures identified by the corresponding 200 series reference numerals included in FIG. 2.

In the memory card 400, the outer body 460 is formed to cover a substantial portion of the second surface 430b of the inner body 430. More particularly, that portion of the outer body 460 covering the second surface 430b of the inner body 430 extends to approximately the second surfaces 420b of the contacts 420. As is further seen in FIG. 4, in the memory card 400, the outer body 460 is also formed to define integral rail portions 460' which extend between adjacent pairs of the contacts 420 toward the first lateral side surface 460c of the outer body 460. The lower edge of each rail portion 460' is substantially flush or continuous with the second surface 460b of the outer body 460. The rail portions 460' each extend over a portion of the second surface 430b of the inner body 430 which is labeled with the reference numeral 430b' in FIG. 4. The second surface portion 430b' of the inner body 430 is located between the second surfaces 420b of the contacts 420 and the first lateral side surface 460c of the outer body 460. As will be recognized, portions or sections of the second surface portion 430b' which are not covered by the rail portions 460' remain exposed in the fully formed memory card 400.

As is further seen in FIG. 4, portions of the second surface 460b of the outer body 460 labeled with the reference numeral 460b' are perpendicularly or vertically recessed relative to the remainder of the second surface 460. These second surface portions 460b' of the outer body 460 are located between the first lateral side surface 460c and the second surface portion 430b' of the inner body 430. In the outer body 460 of the memory card 400, the rounded surface 460e is not continuous, but rather is segmented due to the formation of the rail portions 460' in the outer body 460. The increased thickness of the outer body 460 in the memory card 400 facilitates an improvement in the mechanical strength thereof, therefore reducing its susceptibility to being easily broken by the application of external forces thereto.

Figure 5:
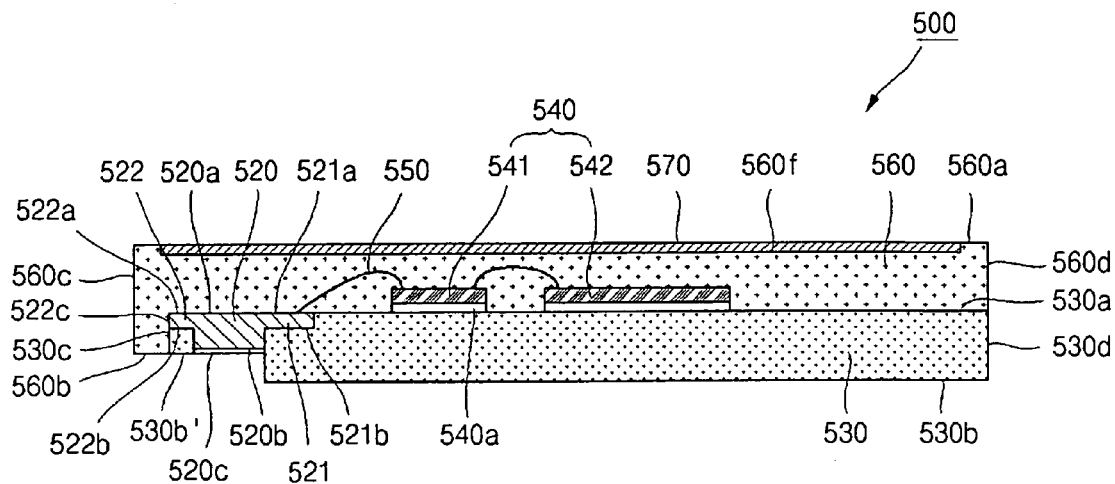
FIG. 5 is a cross-sectional view of a memory card constructed in accordance with a fifth embodiment of the present invention.

Referring now to FIG. 5, there is shown a memory card 500 constructed in accordance with a fifth embodiment of the present invention. The memory card 500 of the fifth embodiment bears similarity to the memory card 200 of the second embodiment, with the 500 series reference numerals in FIG. 5 being used to identify the same structures identified by the corresponding 200 series reference numerals included in FIG. 2. Only the distinctions between the memory cards 500, 200 will be discussed below.

In the memory card 500, the inner body 530 is formed such that a substantial portion of the second surface 530b of the inner body 530 does not extend in co-planar relation to the second surfaces 520b of the contacts 520 or to the outermost surfaces of the plating layers 520c applied to the second surfaces 520b, but rather protrudes vertically or perpendicularly outwardly relative thereto. Thus, as is seen in FIG. 5, only a portion of the second surface 530b labeled with the reference numeral 530b' extends in generally co-planar relation to either the second surfaces 520b of the contacts 520 or the outermost surfaces of the plating layers 520c applied to the second surfaces 520b. The second surface portion 530b' of the inner body 530 is disposed between the second surfaces 520b of the contacts 520 and the second surface 560b of the outer body 560. The increased thickness of the inner body 530 of the memory card 500 makes it less susceptible to being broken by external forces due to its increased mechanical strength.

Figure 6:
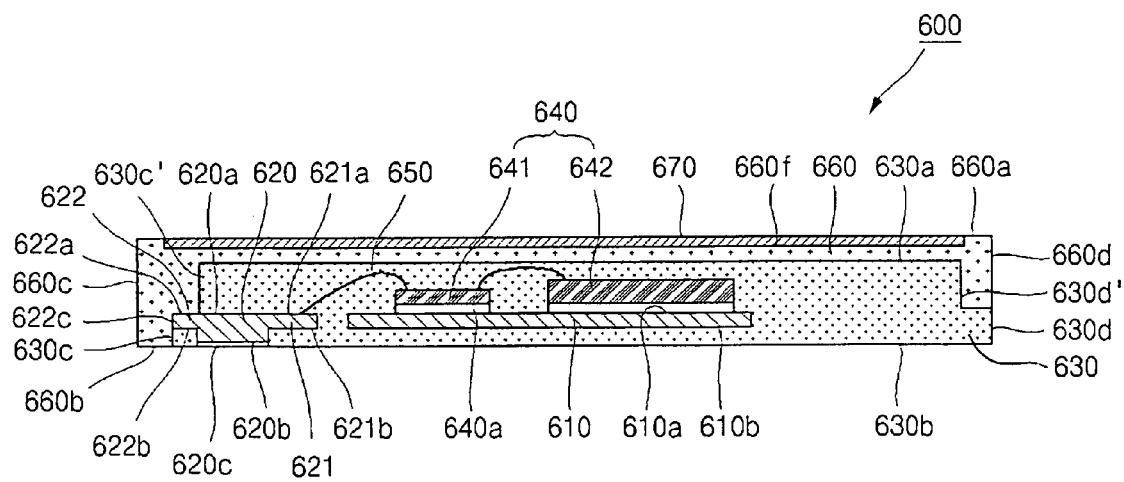
FIG. 6 is a cross-sectional view of a memory card constructed in accordance with a sixth embodiment of the present invention.

Referring now to FIG. 6, there is shown a memory card 600 constructed in accordance with a sixth embodiment of the present invention. The memory card 600 of the sixth embodiment bears similarity in construction to the memory card 100 of the first embodiment, with the 600 series reference numerals in FIG. 6 being used to identify the same structures identified by the corresponding 100 series reference numerals included in FIGS. 1A–1C. Only the distinctions between the memory cards 600, 100 will be discussed below.

In the memory card 600, the thickness of the inner body 630 is increased in comparison to that of the inner body 130, such that the inner body 630 of the memory card 600 fully covers and encapsulates both the die paddle 610 and the electronic circuit element 640 mounted to the first surface 610a of the die paddle 610. In addition, the inner body 630 is formed to cover the first surfaces 620a of the contacts 620 and the first surfaces 621a of the traces 621. Thus, of the leadframe included in the memory card 600, only the first surfaces 622a and outer ends 622c of the tie bar residuals 622 and the second surfaces 620b of the contacts 620 (prior to having the plating layers 620c applied thereto) are exposed in the inner body 630.

As is further seen in FIG. 6, the inner body 630 is formed such that a portion of the first lateral side surface 630c labeled with the reference 630c' is recessed inwardly relative to the remainder of the first lateral side surface 630c. Similarly, a portion of the second lateral side surface 630d labeled with the reference numeral 630d' is recessed inwardly relative to the remainder of the second lateral side surface 630d. The first lateral side surface portion 630c' and the second lateral side surface portion 630d' are each covered by the outer body 660 of the memory card 600. Like the memory card 200 of the second embodiment, the memory card 600 is further distinguishable from the memory card 100 in that the outer body 660 does not include the rounded surface 160e described above in relation to the outer body 160, nor does the electronic circuit element 640 include the passive element 143 of the electronic circuit element 140.

Figure 7:
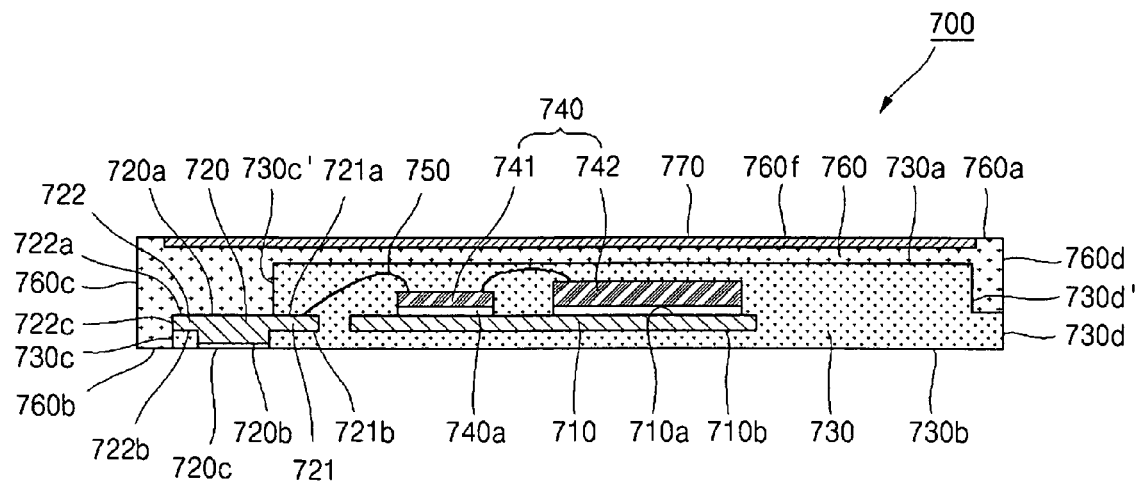
FIG. 7 is a cross-sectional view of a memory card constructed in accordance with a seventh embodiment of the present invention.

Referring now to FIG. 7, there is shown a memory card 700 constructed in accordance with a seventh embodiment of the present invention. The memory card 700 of the seventh embodiment bears substantial similarity in construction to the memory card 600 of the sixth embodiment, with the 700 series reference numerals in FIG. 7 being used to identify the same structures identified by the corresponding 600 series reference numerals included in FIG. 6. Only the distinctions between the memory cards 700, 600 will be discussed below.

The memory card 700 differs from the memory card 600 in that the inner body 730 of the memory card 700 is formed to be slightly smaller than that of the inner body 630 of the memory card 600. In this regard, whereas the inner body 630 is sized to cover both the first surfaces 620a of the contacts 620 and first surfaces 621a of the traces 621, the first surfaces 720a of the contacts 720 in the memory card 700 are not covered by the inner body 730 thereof. Thus, of the various elements included in the leadframe in the memory card 100, the die paddle 710 and traces 721 are fully covered by the inner body 730, with the first surfaces 720a of the contacts 720, first surfaces 722a and outer ends 722c of the tie bar residuals 722, and the second surfaces 720b of the contacts 720 (prior to the application of the plating layers 720c thereto) being exposed in the inner body 730.

Figure 8:
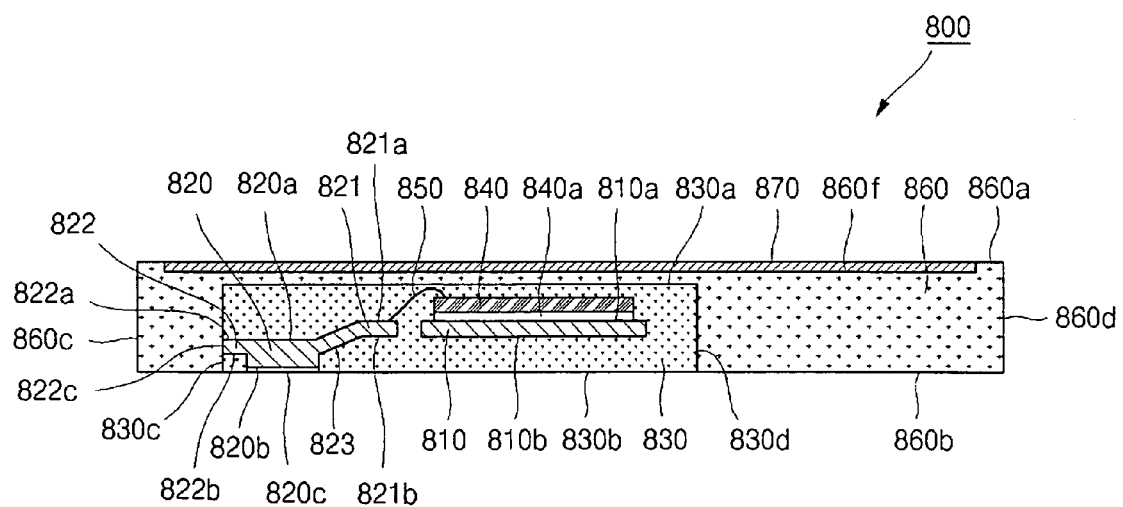
FIG. 8 is a cross-sectional view of a memory card constructed in accordance with an eighth embodiment of the present invention.

Referring now to FIG. 8, there is shown a memory card 800 constructed in accordance with an eighth embodiment of the present invention. The memory card 800 of the eighth embodiment bears similarity in construction to the memory card 700 of the seventh embodiment, with the 800 series reference numerals in FIG. 8 being used to identify the same structures identified by the corresponding 700 series reference numerals is FIG. 7. Only the distinctions between the memory cards 800, 700 will be discussed below.

In the memory card 800, the die paddle 810 of the leadframe is offset such that the first surface 810a of the die paddle 810 and the first surfaces 820a of the contacts 820 extend along respective ones of a spaced, generally parallel pair of planes. Such offset of the die paddle 810 is facilitated through the formation of an angled or sloped portion 823 within each of the traces 821 of the leadframe integrated into the memory card 800. As is seen is seen in FIG. 8, both the die paddle 810 and the electronic circuit element 840 mounted to the first surface 810a thereof through the use of the adhesive layer 840a are completely covered by the inner body 830, as is the entirety of the traces 821 (including the sloped portions 823 thereof), the first surfaces of 820a of the contacts 820, and the first and second surfaces 822a, 822b of the tie bar residuals 822. Also covered by the inner body 830 is/are the conductive wire(s) 850 used to electrically connect the electronic circuit element 840 to the trace(s) 821. The outer ends 822c of the tie bar residuals 822 are exposed in and substantially flush with the first lateral side surface 830c of the inner body 830, with the second surfaces 820b of the contacts 820 (prior to the application of the plating layers 820c thereto) being exposed in the second surface 830b of the inner body 830. Once the plating layers 820c are applied to the second surfaces 820b, such plating layers 820c are exposed in the second surface 830b of the inner body 830.

In the memory card 800, the outer body 860 is formed to completely cover the first surface 830a, first lateral side surface 830c, and second lateral side surface 830d of the inner body 830. The second surface 830b of the inner body 830 is exposed in and substantially flush with the second surface 860b of the outer body 860. Due to the configuration of the outer body 860, the outer ends 822c of the tie bar residuals 822 exposed in the first lateral side surface 830c of the inner body 830 are completely covered by the outer body 860.

Figure 9:
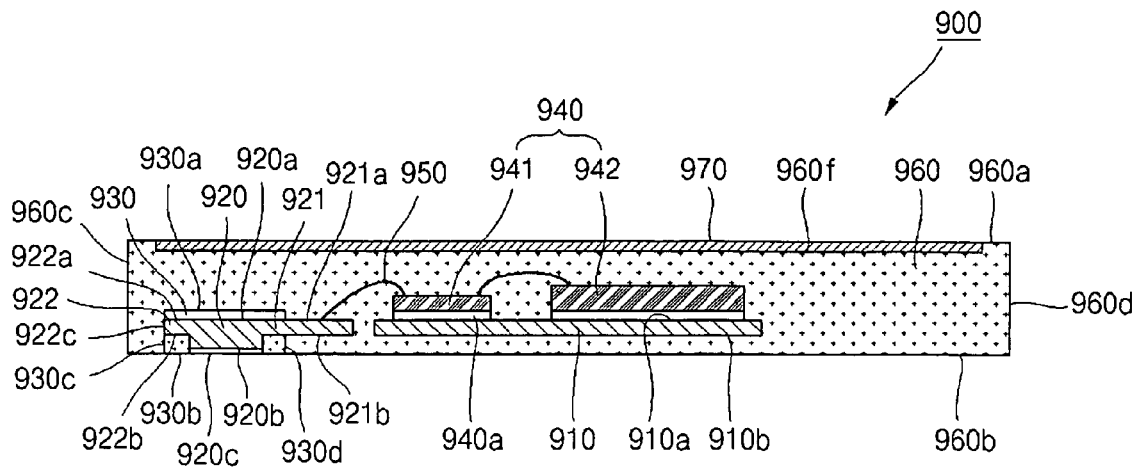
FIG. 9 is a cross-sectional view of a memory card constructed in accordance with a ninth embodiment of the present invention.

Referring now to FIG. 9, there is shown a memory card 900 constructed in accordance with a ninth embodiment of the present invention. The memory card 900 of the ninth embodiment bears similarity in construction to the memory card 700 of the seventh embodiment, with the 900 series reference numerals in FIG. 9 being used to identify the same structures identified by the corresponding 700 series reference numerals included in FIG. 7. In this regard, only the distinctions between the memory cards 900, 700 will be discussed below.

In the memory card 900, the inner body 930 is substantially smaller than the inner body 730 of the memory card 700. In this regard, the inner body 930 of the memory card 900 is formed such that only the first and second surfaces 922a, 922b of the tie bar residuals 922, the first surfaces 920a of the contacts 920, and portions of the first and second surfaces 921a, 921b of the traces 921 are covered by the inner body 930. Substantial portions of the traces 921 protrude from the second lateral side surface 930b of the inner body 930, with the second surfaces 920b of the contacts 920 (prior to the application of the plating layers 920c thereto) being exposed in the second surface 930b of the inner body 930. The outer ends 922c of the tie bar residuals 922 are exposed in and substantially flush with the first lateral side surface 930c of the inner body 930. The protrusion of substantial portions of the traces 921 from the inner body 930 allows for connection of the conductive wire(s) 950 thereto. The conductive wire(s) 950 is/are used to electrically connect the electronic circuit element 940 to the trace(s) 921 and hence the contact(s) 920.

In the memory card 900, the outer body 960 is sized and configured to completely cover the die paddle 910, the electronic circuit element 940 attached to the first surface 910a of the die paddle 910 through the use of the adhesive layers 940a, the conductive wire(s) 950, and those portions of the traces 921 protruding from the second lateral side surface 930d of the inner body 930. The outer body 960 further covers the first surface 920a and first and second lateral side surfaces 930c, 930d of the inner body (and hence the outer ends 922c of the tie bar residuals 922 exposed in the first lateral side surface 930c). Thus, only the second surface 930b of the inner body 930 is exposed in and substantially flush with the second surface 960b of the outer body 960.

Figure 10:
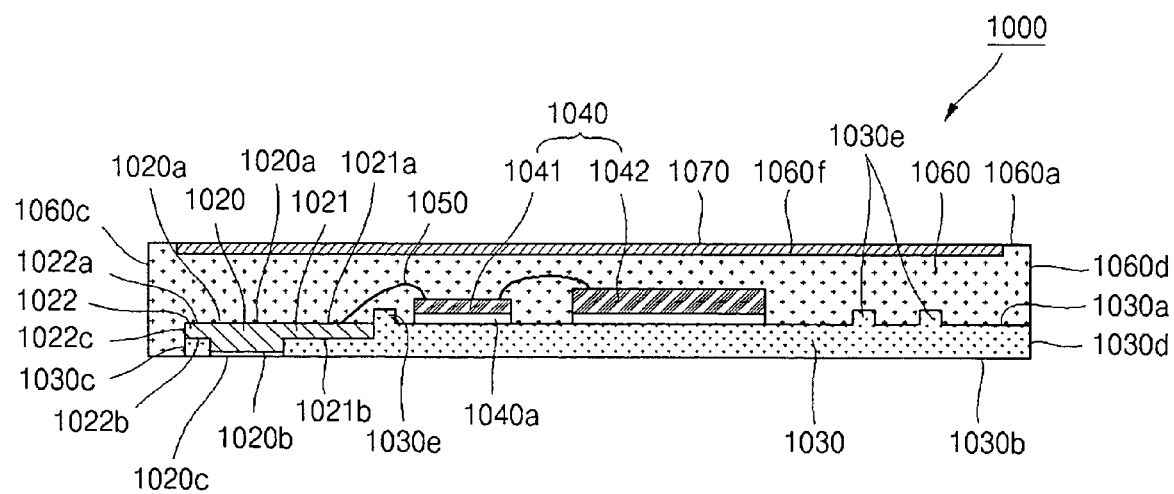
FIG. 10 is a cross-sectional view of a memory card constructed in accordance with a tenth embodiment of the present invention.

Referring now to FIG. 10, there is shown a memory card 1000 constructed in accordance with a tenth embodiment of the present invention. The memory card 1000 of the tenth embodiment bears similarity in construction to the memory card 200 of the second embodiment, with the 1000 series reference numerals in FIG. 10 being used to identify the same structures identified with the corresponding 200 series reference numerals in FIG. 2. Only the distinctions between the memory cards 1000, 200 will be discussed below.

The memory cards 1000, 200 differ from each other in that the inner body 1030 of the memory card 1000 is formed to include at least one projection 1030e protruding upwardly from the first surface 1030a thereof. The projection 1030e may be formed at any position on the first surface 1030a, but preferably at a location which is outboard of the electronic circuit element 1040 attached to the first surface 1030a. As shown in FIG. 10, a plurality of projections 1030e are formed on the first surface 1030a of the inner body 1030. The height or thickness of the projection(s) 1030e is preferably controlled so that they will not contact any of the conductive wires 1050 used to electrically connect the electronic circuit element 1040 to the leadframe integrated into the memory card 1000. The inclusion of the projection(s) 1030e on the inner body 1030 increases the bonding force between the inner body 1030 and the outer body 1060, thus assisting in preventing inadvertent separation therebetween.

Figure 11:
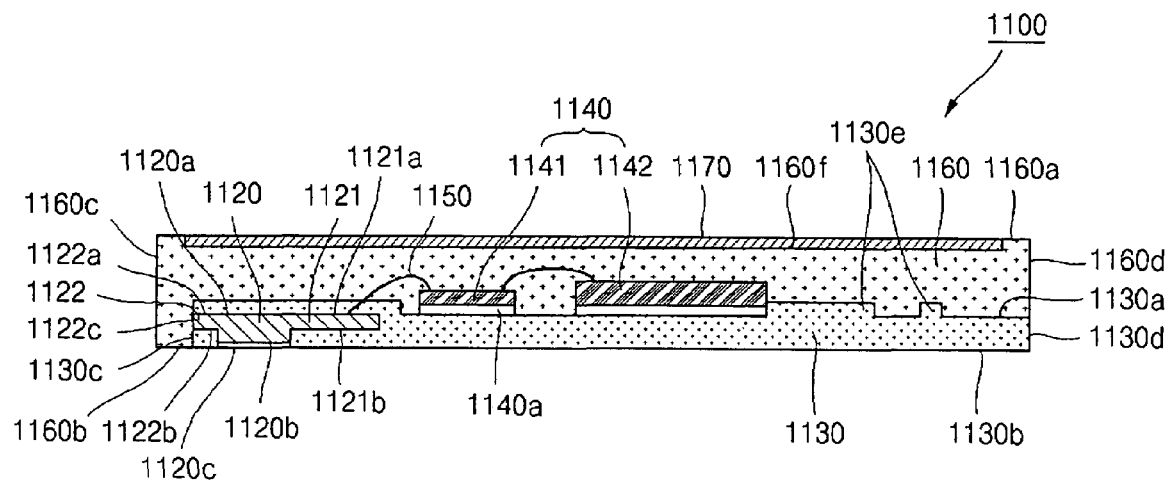
FIG. 11 is a cross-sectional view of a memory card constructed in accordance with a eleventh embodiment of the present invention.

Referring now to FIG. 11, there is shown a memory card 1100 constructed in accordance with an eleventh embodiment of the present invention. The memory card 1100 of the eleventh embodiment bears similarity in construction to the memory card 1000 of the tenth embodiment, with the 1100 series reference numerals in FIG. 11 being used to identify the same structures identified with the corresponding 1000 series reference numerals in FIG. 10. Only the distinctions between the memory cards 1100, 1000 will be discussed below.

The memory card 1100 differs from the memory card 1000 in that in the memory card 1100, the inner body 1130 is sized and configured to completely cover the first surfaces 1122a of the tie bar residuals 1122, the first surfaces 1120a of the contacts 1120, and the first surfaces 1121a of the traces 1120. Additionally, the width of at least one of the projections 1130e is increased so as to extend to and into contact with the electronic circuit element 1140. Like the projections 1030e of the memory card 1000, the projections 1130e of the inner body 1130 of the memory card 1100 increase the bonding force to the outer body 1160 thereof.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card, comprising:
   a die paddle having opposed, generally planar first and second die paddle surfaces and multiple peripheral edge segments;
   a plurality of contacts disposed along and in spaced relation to one of the peripheral edge segments of the die paddle, each of the contacts having opposed, generally planar first and second contact surfaces;
   an inner body partially encapsulating the die paddle and the contacts, the inner body having opposed, generally planar first and second inner body surfaces, the first die paddle surface and the first contact surface of each of the contacts being exposed in and substantially flush with the first inner body surface, with the second contact surface of each of the contacts being exposed in the second inner body surface;
   at least one electronic circuit element attached to the first die paddle surface and electrically connected to at least one of the contacts; and
   an outer body partially encapsulating the inner body such that the first contact surface of each of the contacts, the first die paddle surface, the electronic circuit element, and the first inner body surface are covered by the outer body, and the second inner body surface is exposed in the outer body.

2. The memory card of claim 1 wherein the electronic circuit element is electrically connected to at least one of the contacts via at least one conductive wire which is covered by the outer body.

3. The memory card of claim 1 wherein each of the contacts has a contact thickness between the first and second contact surfaces thereof which exceeds a paddle thickness of the die paddle between the first and second die paddle surfaces thereof.

4. The memory card of claim 1 wherein the first die paddle surface and the first contact surface of each of the contacts extend in generally co-planar relation to each other.

5. The memory card of claim 1 wherein the second contact surface of each of the contacts includes a plating layer applied thereto which is exposed in the second inner body surface of the inner body.

6. The memory card of claim 1 further comprising:
a plurality of conductive traces integrally connected to respective ones of at least some of the contacts and extending toward the die paddle in spaced relation thereto, each of the traces having opposed, generally planar first and second trace surfaces; and
a plurality of tie bar residuals integrally connected to respective ones of the contacts and extending toward the outer body, each of the tie bar residuals having opposed, generally planar first and second tie bar surfaces.

7. The memory card of claim 6 wherein:
the die paddle has a die paddle thickness between the first and second die paddle surfaces thereof;
each of the traces has a trace thickness between the first and second trace surfaces thereof which is substantially equal to the die paddle thickness; and
each of the tie bar residuals has a tie bar thickness between the first and second tie bar surfaces thereof which is substantially equal to the die paddle thickness.

8. The memory card of claim 6 wherein:
each of the tie bar residuals further includes a generally planar outer end; and
the inner body has a generally planar first lateral side surface, the outer ends of the tie bar residuals being exposed in and substantially flush with the first lateral side surface of the inner body.

9. The memory card of claim 8 wherein the first lateral side surface of the inner body and the outer ends of the tie bar residuals exposed therein are covered by the outer body.

10. The memory card of claim 1 wherein the outer body has a first lateral side surface and a rounded surface which extends between the first lateral side surface of the outer body and the second inner body surface of the inner body.

11. The memory card of claim 1 wherein:
the inner body has opposed, generally planar first and second lateral side surfaces; and
the outer body has opposed, generally planar first and second lateral side surfaces; and
the second lateral side surface of the inner body extends in generally co-planar relation to the second lateral side surface of the outer body.

12. The memory card of claim 1 wherein the electronic circuit element is selected from the group consisting of:
a semiconductor package;
a semiconductor die;
a passive element; and
combinations thereof.

13. The memory card of claim 1 wherein at least one of the contacts is integrally connected to the die paddle.

14. A memory card, comprising:
a plurality of contacts, each of the contacts having opposed, generally planar first and second contact surfaces;
an inner body partially encapsulating the contacts, the inner body having opposed, generally planar first and second inner body surfaces, the first contact surface of each of the contacts being exposed in and substantially flush with the first inner body surface, with the second contact surface of each of the contacts being exposed in the second inner body surface;
at least one electronic circuit element attached to the first inner body surface and electrically connected to at least one of the contacts; and
an outer body partially encapsulating the inner body such that the first contact surface of each of the contacts, the electronic circuit element, and the first inner body surface are covered by the outer body, and the second inner body surface is exposed in the outer body.

15. The memory card of claim 14 wherein the electronic circuit element is electrically connected to at least one of the contacts via at least one conductive wire which is covered by the outer body.

16. The memory card of claim 14 wherein the second contact surface of each of the contacts includes a plating layer applied thereto which is exposed in the second inner body surface of the inner body.

17. The memory card of claim 14 wherein:
an interposer is attached to the first inner body surface of the inner body; and
the electronic circuit element is attached and electrically connected to the interposer.

18. The memory card of claim 14 further comprising:
a plurality of conductive traces integrally connected to respective ones of at least some of the contacts and extending toward the electronic circuit element, each of the traces having opposed, generally planar first and second trace surfaces; and
a plurality of tie bar residuals integrally connected to respective ones of the contacts and extending toward the outer body, each of the tie bar residuals having opposed, generally planar first and second tie bar surfaces.

19. The memory card of claim 18 wherein:
each of the tie bar residuals further includes a generally planar outer end; and
the inner body has a generally planar first lateral side surface, the outer ends of the tie bar residuals being exposed in and substantially flush with the first lateral side surface of the inner body.

20. The memory card of claim 19 wherein the first lateral side surface of the inner body and the outer ends of the tie bar residuals exposed therein are covered by the outer body.

21. The memory card of claim 18 wherein:
each of the contacts has a contact thickness between the first and second contact surfaces thereof;
each of the traces has a trace thickness between the first and second trace surfaces thereof which is less than the contact thickness; and
each of the tie bar residuals has a tie bar thickness between the first and second tie bar surfaces thereof which is less than the contact thickness.

22. The memory card of claim 14 wherein:
each of the contacts has a contact thickness between the first and second contact surfaces thereof; and at least a portion of the inner body has an inner body thickness between the first and second inner body surfaces thereof which exceeds the contact thickness.

23. The memory card of claim 14 wherein the outer body is formed to cover at least a portion of the second inner body surface of the inner body.

24. A memory card, comprising:
- a die paddle having opposed, generally planar first and second die paddle surfaces and multiple peripheral edge segments;
- a plurality of contacts disposed along and in spaced relation to one of the peripheral edge segments of the die paddle, each of the contacts having opposed, generally planar first and second contact surfaces;
- at least one electronic circuit element attached to the first die paddle surface and electrically connected to at least one of the contacts;
- an inner body encapsulating the die paddle and the electronic circuit element and partially encapsulating the contacts, the inner body having opposed, generally planar first and second inner body surfaces, with the second contact surface of each of the contacts being exposed in the second inner body surface; and
- an outer body partially encapsulating the inner body such that the second inner body surface is exposed in the outer body.

25. The memory card of claim 24 wherein the first contact surface of each of the contacts is covered by the outer body.

26. The memory card of claim 24 wherein the first contact surface of each of the contacts and the first die paddle surface of the die paddle extend along respective ones of a spaced, generally parallel pair of planes.

27. A memory card, comprising:
- a die paddle having opposed, generally planar first and second die paddle surfaces and multiple peripheral edge segments;
- a plurality of contacts disposed along and in spaced relation to one of the peripheral edge segments of the die paddle, each of the contacts having opposed, generally planar first and second contact surfaces;
- at least one electronic circuit element attached to the first die paddle surface and electrically connected to at least one of the contacts;
- an inner body partially encapsulating the contacts, the inner body having opposed, generally planar first and second inner body surfaces, the second contact surface of each of the contacts being exposed in the second inner body surface; and
- an outer body encapsulating the die paddle and the electronic circuit element and partially encapsulating the inner body such that the first inner body surface is covered by the outer body, and the second inner body surface is exposed in the outer body.

28. A memory card, comprising:
- a plurality of contacts, each of the contacts having opposed, generally planar first and second contact surfaces;
- an inner body partially encapsulating the contacts, the inner body having opposed first and second inner body surfaces, the second contact surface of each of the contacts being exposed in the second inner body surface, with the first inner body surface further including at least one projection formed thereon;
- at least one electronic circuit element attached to the first inner body surface and electrically connected to at least one of the contacts; and
- an outer body partially encapsulating the inner body such that the electronic circuit element, the first inner body surface, and the at least one projection are covered by the outer body, and the second inner body surface is exposed in the outer body.

29. The memory card of claim 28 wherein the inner body is formed to cover the first contact surface of each of the contacts.

* * * * *